United States Patent
Shintri et al.

(10) Patent No.: US 9,735,057 B2
(45) Date of Patent: Aug. 15, 2017

(54) FABRICATING FIELD EFFECT TRANSISTOR(S) WITH STRESSED CHANNEL REGION(S) AND LOW-RESISTANCE SOURCE/DRAIN REGIONS

(71) Applicant: GLOBALFOUNDRIES Inc., Grand Cayman (KY)

(72) Inventors: Shashidhar Shreeshail Shintri, Troy, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 103 days.

(21) Appl. No.: 14/262,882

(22) Filed: Apr. 28, 2014

(65) Prior Publication Data

US 2015/0311120 A1 Oct. 29, 2015

(51) Int. Cl.
*H01L 29/66* (2006.01)
*H01L 21/8234* (2006.01)
(Continued)

(52) U.S. Cl.
CPC ........... *H01L 21/823418* (2013.01); *H01L 21/823807* (2013.01); *H01L 21/823821* (2013.01);
(Continued)

(58) Field of Classification Search
CPC ....... H01L 21/823814; H01L 29/66628; H01L 29/7834; H01L 29/7848; H01L 21/823807; H01L 21/823418
See application file for complete search history.

(56) References Cited

U.S. PATENT DOCUMENTS 7,960,236 B2 6/2011 Chopra et al.
8,236,660 B2 * 8/2012 Chan et al. ..... H01L 21/823807
257/E21.562
(Continued)

OTHER PUBLICATIONS

H J Osten et al., "Strain Relaxation in Tensile-Strained Si1—yCy Layers on SI (001)", IOP Science, Semicond. Sci. Technol. 11 1678, Jul. 10, 1996, 11 pages.

*Primary Examiner* — Marc Armand
*Assistant Examiner* — Sarah Salerno
(74) *Attorney, Agent, or Firm* — Heslin Rothenberg Farley & Mesiti P.C.; Kristian E. Ziegler

(57) ABSTRACT

Methods of fabricating field effect transistors having a source region and a drain region separated by a channel region are provided which include: using a single mask step in forming a first portion(s) and a second portion(s) of at least one of the source region or the drain region, the first portion(s) including a first material selected and configured to facilitate the first portion(s) stressing the channel region, and the second portion(s) including a second material selected and configured to facilitate the second portion(s) having a lower electrical resistance than the first portion(s). One embodiment includes: providing the first material with a crystal lattice structure; and forming the second material by disposing another material interstitially with respect to the crystal lattice structure. Another embodiment includes forming the first portion and the second portion within at least one of a source cavity or a drain cavity of the semiconductor substrate.

18 Claims, 6 Drawing Sheets

(51) Int. Cl.
*H01L 29/78* (2006.01)
*H01L 21/8238* (2006.01)
*H01L 29/08* (2006.01)
H01L 29/267 (2006.01)
H01L 29/165 (2006.01)

(52) U.S. Cl.
CPC .... *H01L 29/0847* (2013.01); *H01L 29/66628* (2013.01); *H01L 29/66636* (2013.01); *H01L 29/7848* (2013.01); H01L 21/823412 (2013.01); H01L 29/165 (2013.01); H01L 29/267 (2013.01)

(56) References Cited

U.S. PATENT DOCUMENTS

| 8,609,498 | B2* | 12/2013 | Kronholz et al. ............... H01L 21/823807 438/199 |
| 2015/0214345 | A1* | 7/2015 | Wan .................... H01L 29/7848 257/105 |
| 2015/0236124 | A1* | 8/2015 | Chang ............... H01L 29/66628 257/288 |

* cited by examiner

FABRICATING FIELD EFFECT TRANSISTOR(S) WITH STRESSED CHANNEL REGION(S) AND LOW-RESISTANCE SOURCE/DRAIN REGIONS

FIELD OF THE INVENTION

The present invention relates to methods of manufacturing semiconductor structures, and more particularly, to methods for fabricating field effect transistors with stressed channel regions and low-resistance source regions and/or drain regions.

BACKGROUND OF THE INVENTION

The performance of a field effect transistor may be characterized by its switching speed. One way to increase transistor switching speed is to enhance the mobility of charge carriers in a channel region of the transistor. Strain, such as tensile or compressive strain, may be used to increase the switching speed of the field effect transistor, because appropriate configurations of strain, for example, tensile and compressive strain, can enhance the mobility of charge carriers, such as electrons and holes. For example, the channel region of the field effect transistor may be strained by using certain channel fabrication techniques and selecting appropriate channel materials.

BRIEF SUMMARY

The shortcomings of the prior art are overcome, and additional advantages are provided, through the provision, in one aspect, of a method for fabricating a field effect transistor, the field effect transistor including a source region and a drain region separated by a channel region. The method includes using a single mask step in forming a first portion and a second portion of at least one of the source region or the drain region, the first portion including a first material selected and configured to facilitate the first portion stressing the channel region, and the second portion including a second material selected and configured to facilitate the second portion having a lower resistance than the first portion.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
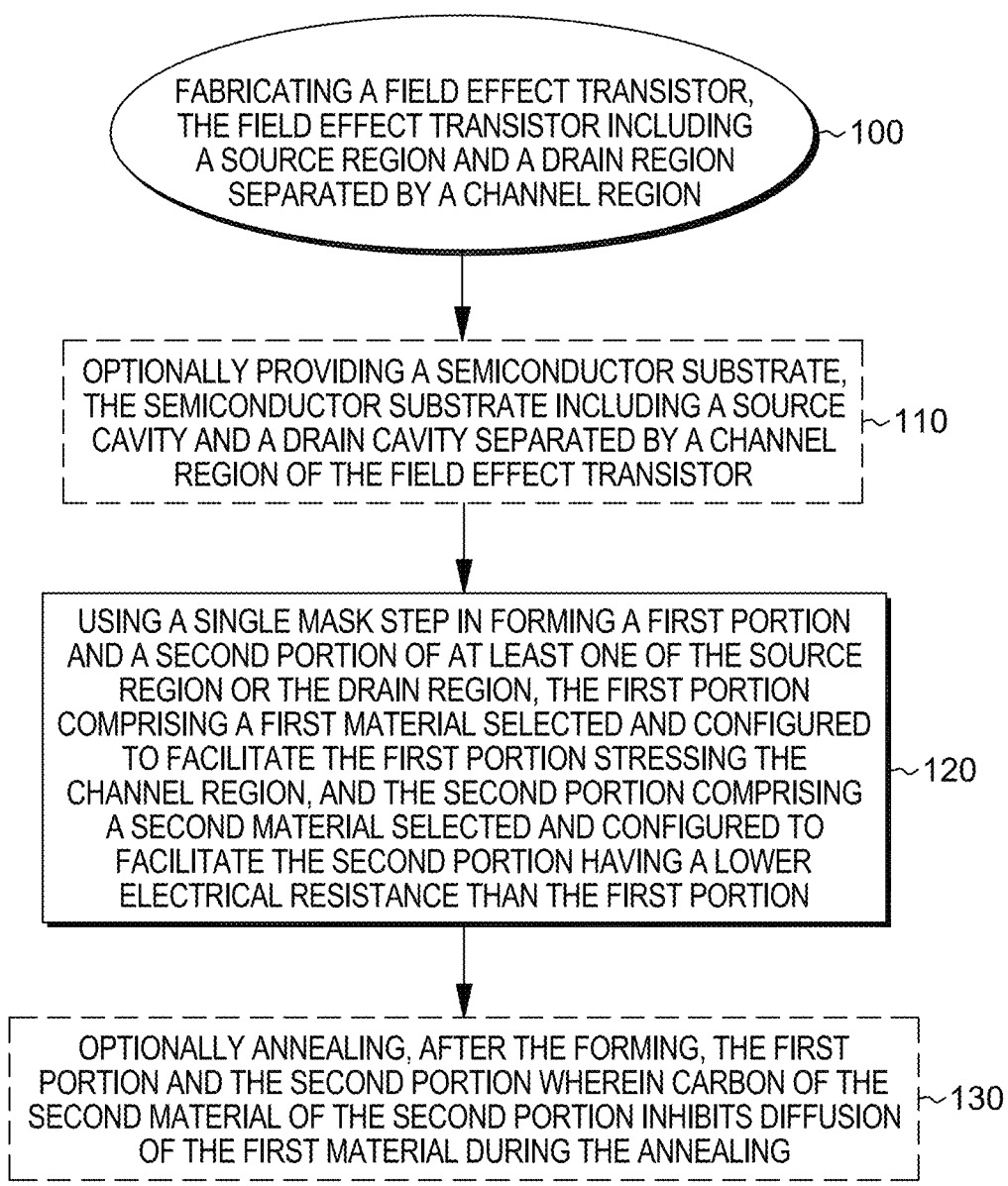
FIGS. 1A-1E depict multiple embodiments of a process for fabricating field effect transistors, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, methods for fabricating field effect transistors with stressed channel regions and low-resistance source regions and/or drain regions. In operation of a field effect transistor, when an appropriate voltage is applied on a gate structure, charge carriers will flow from a source region to a drain region through a channel region. As such, an increase in the mobility of charge carriers in the channel region will allow for a faster switching time of the transistor. One technique to increase mobility of charge carriers is to stress the channel region. Such techniques may be used for both p-type and n-type transistors, because tensile strains increase the mobility of electrons, and compressive strains increase the mobility of holes.

During the fabrication of integrated circuits, numerous transistors and other circuit structures may be formed on a single wafer. Several issues may arise during fabrication processing, which could negatively impact performance or yield of the integrated circuits. For example, in forming an integrated circuit, electrical contact must be made to the source regions and the drain regions of a transistor, by, for example, an overlying metal layer. Therefore, it is desirable that the source regions and the drain regions have low electrical resistance, to facilitate electrical contact and enable high performance of the transistor. In another example, during fabrication, earlier formed circuit structures may be exposed to necessary subsequent processing steps, such as annealing, which may cause structural changes to the circuit structure, if the circuit structures are sensitive to, for example, heat treatment. Such sensitivity may impose limitations on subsequent processing steps, or necessitate complicated workarounds. In a further example, multiple processing steps, such as multiple uses of an epitaxial growth chamber, will lead to increased overall fabrication costs.

Reference is made below to the drawings, which are not drawn to scale for ease of understanding, wherein the same reference numbers used throughout different figures designate the same or similar components.

By way of summary, FIGS. 1A-1E depict certain embodiments of methods for fabricating a field effect transistor, the field effect transistor, in accordance with one or more aspects of the present invention.

As illustrated in FIG. 1A, in one embodiment, the method may include using a single mask step in forming a first portion and a second portion of at least one of the source region or the drain region, the first portion including a first material selected and configured to facilitate the first portion stressing the channel region of the transistor, and the second portion including a second material selected and configured to facilitate the second portion having a lower electrical resistance than the first portion 120.

In one implementation, selecting or configuring a first material, to facilitate the first portion stressing the channel, includes selecting a material with a different material or electrical property, such as lattice constant, lattice structure, or density, than the material of a substrate, in order to facilitate the stressing. In another implementation, the configuring may include selecting a material having a lattice structure, which may be oriented in a particular manner with respect to the channel region or other structures, or may include providing a material in a particular chemical or molecular configuration.

In one example, selecting or configuring a second material, to facilitate the second portion having a lower resistance than the first portion, includes selecting a material with specific electrical, chemical, or material properties, in order to facilitate the lower resistance. In another example, the configuring may include positioning or distributing the material in a particular manner that causes other materials to have lower resistance, or prevents an increase of resistance during subsequent processing steps, which may include exposure to heat treatment.

By way of example, the first material may include silicon phosphide ($Si_3P_4$) and the other material may include carbon. In one example, the first material may be heavily phosphorous doped epitaxial Si, which may contain an $Si_3P_4$ phase locally in the material together with randomly distributed P atoms in Si crystal lattice, and the other material may be epitaxial Si with in situ doped C (e.g., with approximately 0.5-2% C) within the Si crystal lattice either substitutionally or interstitially. For instance, epitaxial deposition parameters such as temperature or pressure may result in different amounts of substitutional and/or interstitial atoms. In one specific example, P doping in Si lattice results in an n-type conduction mechanism with electron charge carriers.

In a further example, the first material of the first portion includes an internal tensile strain, the internal tensile strain inducing a (e.g., tensile) stress on the channel region, the stress facilitating increased mobility of charge carriers (e.g., electrons) within the channel region of the field effect transistor. In another example, the second material includes the first material. In an embodiment, both the source and drain regions have tensile stress to collectively induce tensile stress in the channel region (e.g., to enhance electron mobility).

In another embodiment, the method includes, before the forming, a providing a semiconductor substrate, the semiconductor substrate including a source cavity and a drain cavity separated by the channel region of the field effect transistor 110. In a further embodiment, the second material includes carbon, and the method includes annealing, after the forming, the first portion and the second portion, where the carbon of the second material of the second portion inhibits diffusion of the first material during the annealing 130. In one specific example, the carbon of the second material of the second portion inhibits diffusion of phosphorous during the annealing. In such a case, the phosphorous may be phosphorous in the first and/or second portions.

In a further embodiment, the method includes fabricating a plurality of field effect transistors, the plurality of field effect transistors including the field effect transistor and other field effect transistors, and the forming includes: providing a protective mask over the other field effect transistors; forming, after the providing, the first portion and the second portion of the at least one of the source region or the drain region of the field effect transistor; and removing, after the forming, the protective mask from over the other field effect transistors. For instance, the other field effect transistors may be p-type field effect transistors, which are protected by the protective mask during fabrication of n-type field effect transistors.

Figure 1B:
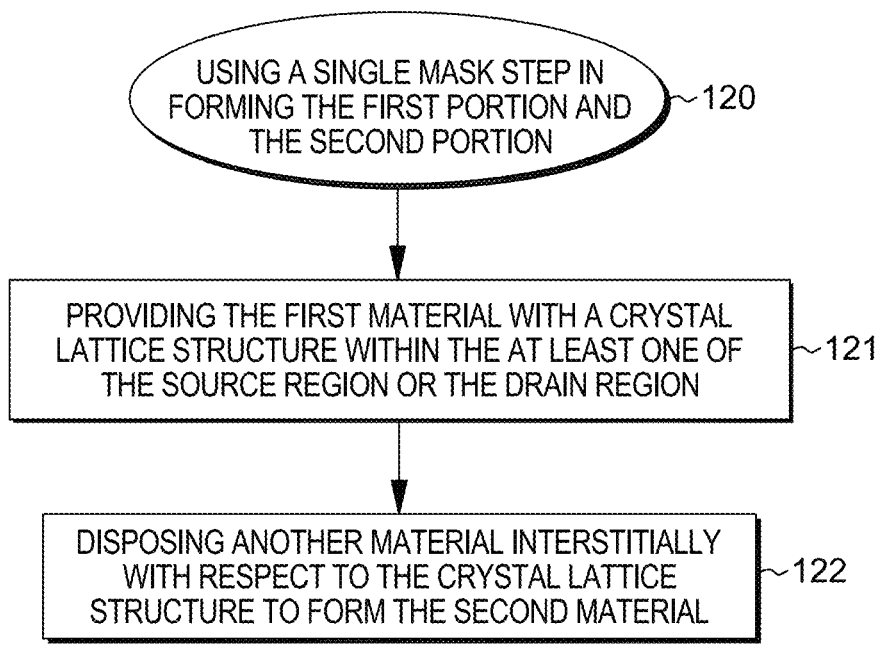

With regard to FIG. 1B, in one implementation, the forming 120 includes providing the first material with a crystal lattice structure within the at least one of the source region or the drain region 121. In such an implementation, the method may further include disposing another material interstitially (or substitutionally) with respect to the crystal lattice structure of the first material to form the second material of the second portion of the at least one of the source region or the drain region 122.

Figure 1C:
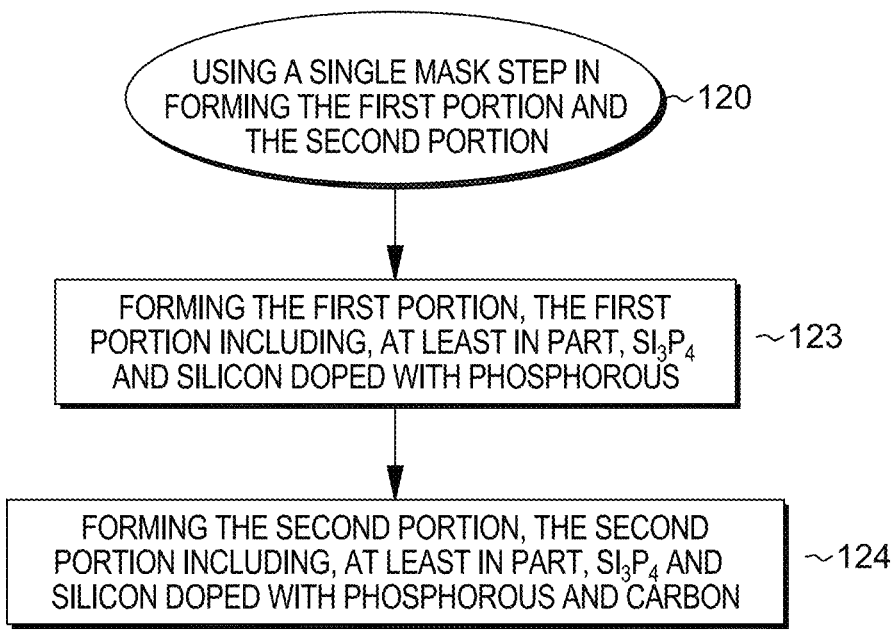

As illustrated in FIG. 1C, in another implementation where the first material includes silicon and phosphorous, and the forming 120 may include forming the first portion, the first portion including, at least in part, $Si_3P_4$ 123. In such a case, where the second material includes silicon, phosphorous, and carbon, the method may further include forming the second portion, the second portion including, at least in part, carbon 124. In one implementation, phosphorous in the source and/or drain provides n-type conductivity with low resistivity, enabling, for example, an NFET.

Figure 1D:
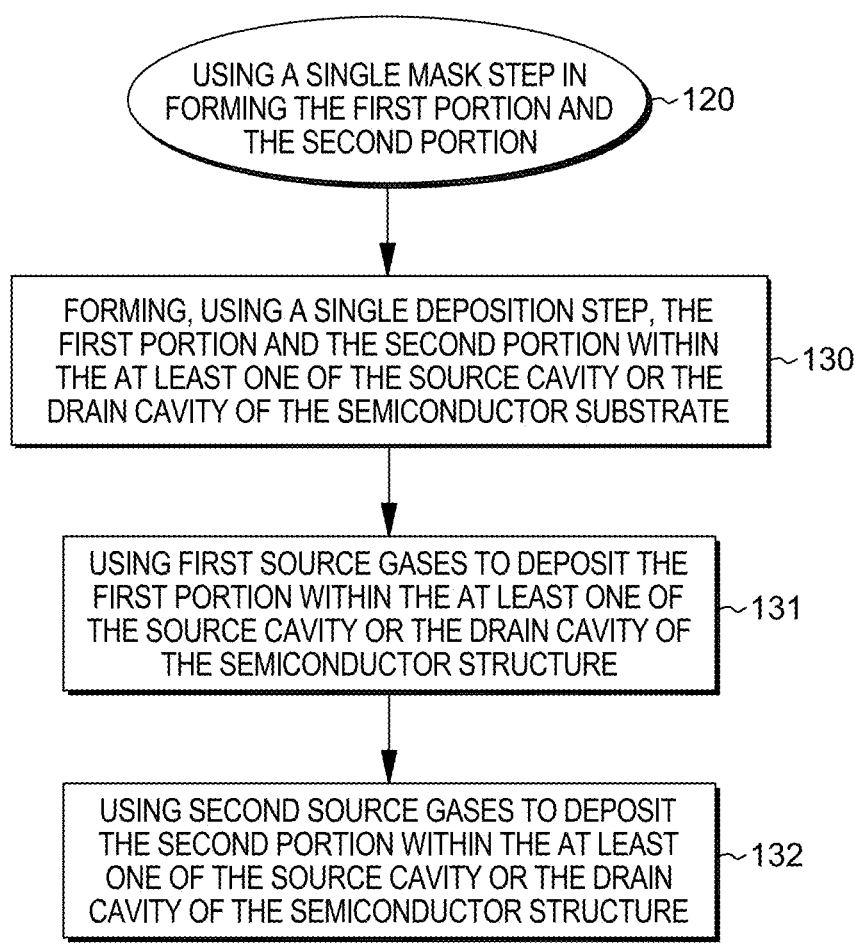

Turning to FIG. 1D, in a further implementation, the forming 120 includes forming, using a single step, the first portion and the second portion within at least one of the source cavity or the drain cavity of the semiconductor substrate 130. In one such implementation, the forming includes: using first source gases to deposit the first portion within the at least one of the source cavity or the drain cavity of the semiconductor structure 131; and using second source gases to deposit the second portion over the first portion, the second source gases including, at least in part, the first source gases 132. The source gases may be selected to achieve the desired configuration of the source region and/or the drain region, and in one example, the first source gases include phosphine and the second source gases include phosphine and methylsilane. In such case, the first and second source gases may also include silane.

Figure 1E:
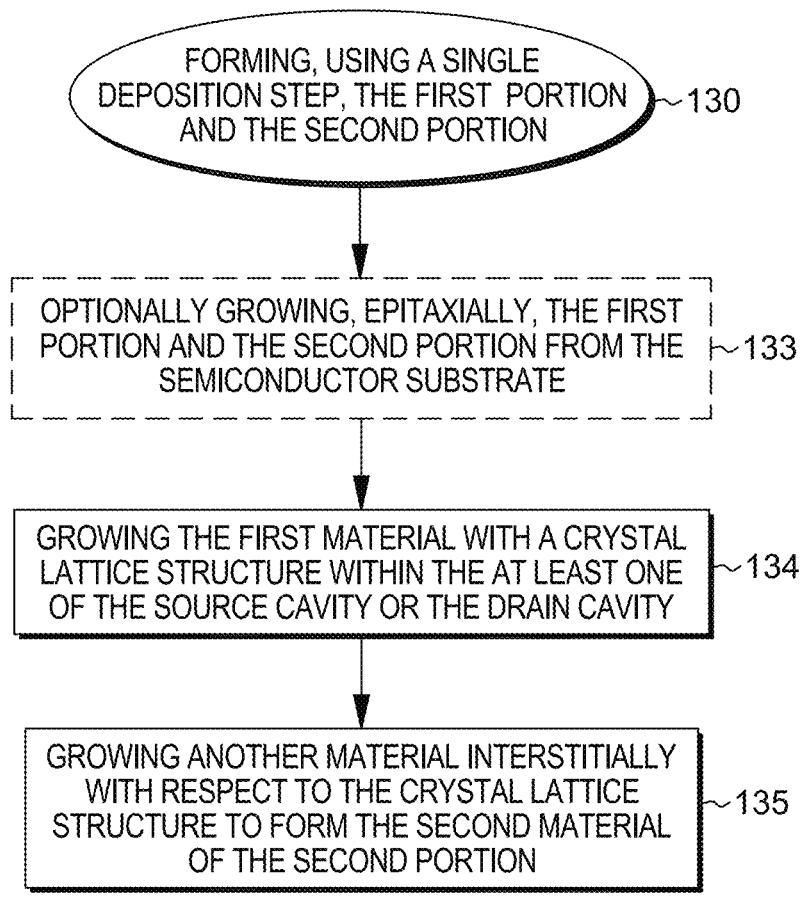

As illustrated in FIG. 1E, one example of the forming 120 includes growing, epitaxially, the first portion and the second portion from a semiconductor substrate within at least one of a source cavity or a drain cavity 133. In another example, the method could include growing the first material with a crystal lattice structure within the at least one of the source cavity or the drain cavity 134; and providing another material interstitially with respect to the crystal lattice structure of the first material to form the second material of the second portion 135. The interstitial material may be or include, in one specific example, carbon. In another specific example, the other material may be provided both interstitially and substitutionally.

In one embodiment, the forming includes using the single mask step in forming the first portion the source region and a first portion of the drain region, and the second portion of the source region and a second portion of the drain region, the first portions including a first material selected and configured to facilitate the first portions stressing the channel region, and the second portions including a second material selected and configured to facilitate the second portions having a lower resistance than the first portions.

In another embodiment, the first portion is one of multiple first portions and the second portion is one of multiple second portions, and the forming includes forming the multiple first portions and the multiple second portions, the multiple first portions including the first material, and the multiple second portions including the second material, where the multiple first portions are interleaved with the multiple second portions.

Figure 2A:
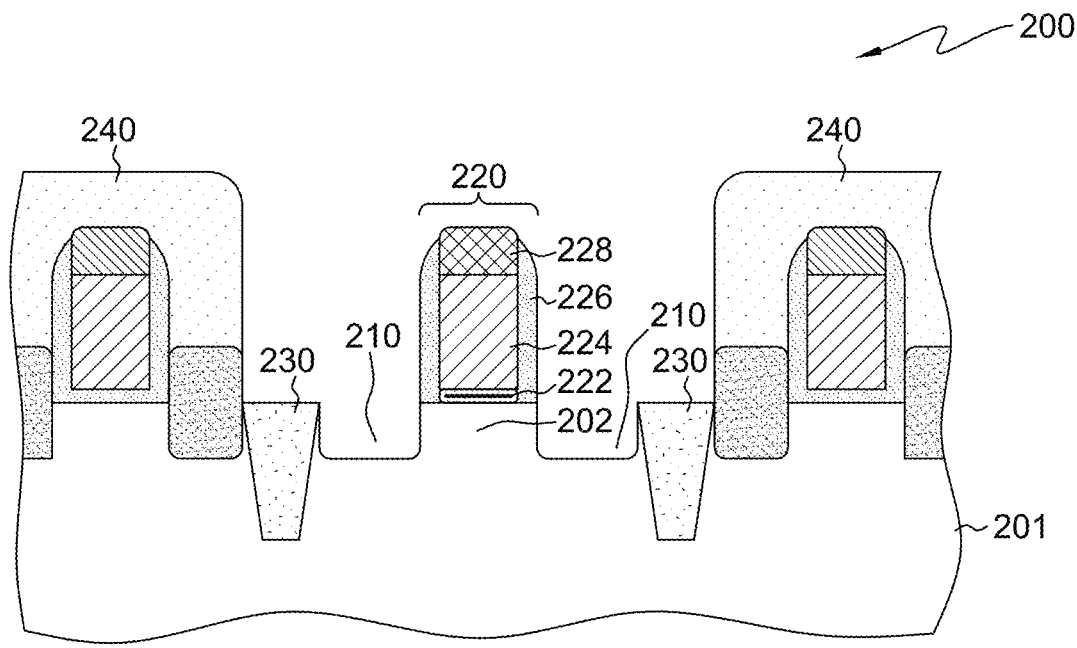
FIG. 2A is a cross-sectional elevational view of a structure obtained during one embodiment of a field effect transistor fabrication process, in accordance with one or more aspects of the present invention.
Figure 2B:
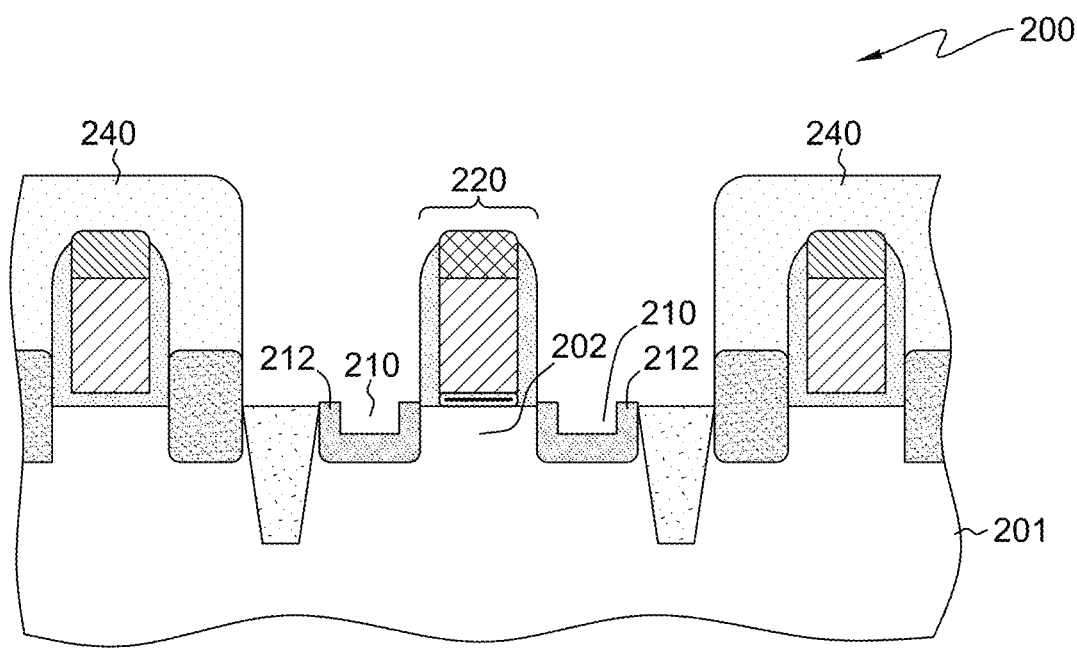
FIG. 2B depicts forming a first portion of at least one of the source region or the drain region of a field effect transistor, in accordance with one or more aspects of the present invention.
Figure 2C:
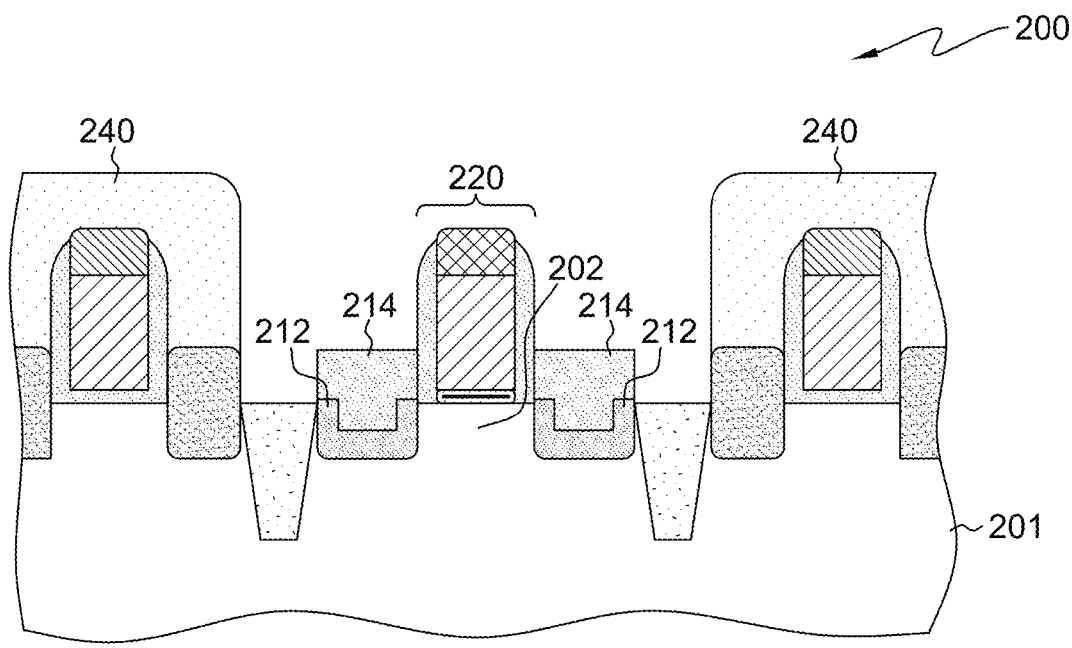
FIG. 2C depicts forming a second portion of the at least one of the source region or the drain region of the field effect transistor, in accordance with one or more aspects of the present invention.

FIGS. 2A-2C illustrate one specific embodiment of a process for fabricating a field effect transistor, in accordance with one or more aspects of the present invention.

FIG. 2A is a cross-sectional elevational view of a structure 200 obtained during one embodiment of a field effect transistor fabrication process. In the illustrated example, a substrate 201, which may be a semiconductor substrate, has been provided, and includes one or more cavities 210, including a source cavity and a drain cavity separated by a channel region 202 of substrate 201. In this example, channel region 202 underlies a gate structure 220. As described below with respect to FIGS. 2B-2C, source regions and/or drain regions may be formed at least partially within cavities 210 of substrate 201. Note that structure 200 may be an entire wafer upon which millions or more field effect transistors may be simultaneously fabricated during the steps to be discussed below.

By way of example, substrate 201 may be a bulk semiconductor material such as a bulk silicon wafer. In another example, the substrate may be or include any silicon-containing substrate material including, but not limited to, single crystal Si, polycrystalline Si, amorphous Si, Si-on-nothing (SON), Si-on-insulator (SOI), or Si-on-replacement insulator (SRI) substrates and the like, and may be n-type or p-type doped as desired for a particular application. In a further example, the substrate may be, for instance, a wafer or substrate approximately 600-700 micrometers thick, or less. The substrate may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof; or an alloy semiconductor including GaAsP, AlInAs, GaInAs, GaInP, or GaInAsP or combinations thereof. In another example, substrate 201 may include multiple layers of material.

In order to form cavities 210 within substrate 201, a variety of processing techniques to pattern substrate 201 and remove material thereof may be employed. For example, substrate 201 may be patterned using direct lithography, sidewall image transfer techniques, extreme ultraviolet lithography (EUV), e-beam techniques, litho-etch litho-etch technique, or litho-etch litho-freeze technique. Following patterning, material of substrate 201 may be removed to form cavities 210. In one example, after forming cavities 210, substrate 201 may be deposited and/or implanted with another material layer below cavities 210. In such a case, the other material layer could be or include carbon or silicon doped with carbon. Removal may be accomplished using any suitable removal process, such as an etching process with an etchant selective to, for instance, the material of the substrate. In one example, etching may be an anisotropic etching, such as reactive ion etching (RIE), using an appropriate chemistry, depending on the material of the substrate. In a specific example, the reactive ion etching may be performed using fluorine based chemistry and gases such as tetrafluoromethane ($CF_4$), trifluoromethane ($CHF_3$), difluoromethane ($CH_2F_2$), fluoromethane ($CH_3F$), octofluoromethane ($C_4F_8$), hexafluoro-1,3-butadiene ($C_4F_6$), sulfur hexafluoride ($SF_6$), oxygen ($O_2$), and the like. In one implementation, cavities 210 may be box shaped with nearly perpendicular side walls. In another implementation, cavities 210 may have other shapes, and may have angular sidewalls. In one specific implementation, cavities 210 are a sigma cavity, which is named for the resemblance between the Greek-letter $\Sigma$ (sigma) and the profile of its angular planes, which may include {111}, {110}, and/or {100}planes.

In the illustrated embodiment, a gate structure 220 overlies channel region 202. This depicts a typical gate-first process, in which gate structures are provided before establishment of the source region and the drain region of the field effect transistor. By way of example only, gate structure 220 may include a gate metal 224 disposed above a gate dielectric 222, surrounded by spacers 226. A gate cap 228 may be provided over gate metal 224. In other examples of the present technique, a gate-last process may be employed, in which gate structures are provided after establishment of the source region and the drain region. In such examples, a sacrificial gate structure may overlie channel region 202. The gate structures and spacers may be used as etch masks to self align the cavities with respect to the channel regions.

In another embodiment, a substrate may include one or more three-dimensional fin structures, which extend from the substrate. In such a case, gate structures may wrap up, over, and around the fin structures. An applied gate voltage may then be applied to two or more sides of a fin structure (in particular, to a channel region of the fin structure), allowing for a greater current to flow between a source region and a drain region during operation of a field effect transistor. In such an example, a source region and a drain region, to be provided within the cavities, can apply stress on a two-dimensional surface of the channel region at the boundary of the source region or the drain region and the channel region.

Continuing with respect to FIG. 2A, in the illustrated embodiment, a protective mask 240 is provided over other portions of structure 200, including, for example, other field effect transistors, to prevent exposure of the other portions to the fabrication steps used to form the source regions and/or drain regions within cavities 210. Protective mask 240 may be, in one example, an organic layer such as a siloxane-based material, having a thickness of between 50 to 100 nanometers, and could be deposited using a variety of techniques, including spin-on deposition. In another example, protective mask 240 may be a hard mask, and may include, for example a thin layer of silicon nitride or silicon oxide. In one implementation, protective mask 240 may be disposed over portions of structure 200 that are designated to include p-type field effect transistors, to limit the processing described herein from affecting those portions.

Also depicted, in this example, shallow trench isolation regions 230 may be provided between adjacent field effect transistors to allow for electrical isolation of the field effect transistors. Shallow trench isolation regions 230 may include any appropriate dielectric material.

FIG. 2B illustrates forming a first portion 212 of at least one of a source region or a drain region of the field effect transistor. In the illustrated embodiment, first portion 212 may be formed within the at least one cavity 210, and includes a first material selected and configured to facilitate first portion 212 stressing channel region 202. As depicted, in one example, first portion 212 may have a U-shaped cross-section, and may reach slightly above (or below) the level of substrate 201, due to, for example, conformal formation, at least partially, within cavity 210. In another example, first portion 212 could be a layer of material with a flat cross sectional shape.

In one embodiment, the first material of first portion 212 is selected and configured to have an internal stress/strain. The internal stress/strain may be, for example, a tensile strain, which is a relative elongation of a body, or a compressive strain, which is a relative compression of the body. In either case, the internal strain of first portion 212 would induce stress/strain along the channel region. A stress is a pressure or tension acting on a body, such as the channel region. The internal strain may be tailored to be a compressive stress or a tensile stress, depending on the type of transistor being fabricated. For example, p-type transistors, such as p-type field effect transistors (PFETs), have holes as majority charge carriers, and compressive stress increases hole mobility. On the other hand, n-type transistors, such as n-type field effect transistors (NFETs), have electrons as charge carriers, and tensile stress increases the electron mobility. In one specific example, configuring the first material of first portion 212 with an internal tensile strain allows the first portion to stress the channel region, thereby increasing electron mobility therein, for an NFET.

By way of illustration, in an example where semiconductor substrate 201 includes crystalline silicon, first portion 212 may include a first material that is selected and configured to include both $Si_3P_4$ (e.g., a phase) and silicon doped with phosphorous (e.g., with P atoms randomly distributed in lattice). In such a case, providing the first material with a crystal lattice structure within the at least one cavity 210 will lead to an internal tensile stress/strain within first portion 212, because the lattice constant of $Si_3P_4$ is smaller than the lattice constant of silicon. The mismatch in lattice constants will lead to the first portion 212 stressing channel region 202. Either or both of the source cavity and the drain cavity may include a first portion, to stress channel region 202 (e.g., to induce tensile stress/strain), depending on the amount of stress desired. In other examples, instead of silicon with phosphorous, silicon with arsenic may be chosen to induce compressive stress/strain along channel region 202. In such an example, because arsenic atoms are larger than silicon atoms, arsenic doped silicon will generate and induce compressive stress/strain in the channel region.

In another embodiment, in order to form first portion 212, first source gases are used to deposit first portion 212 within the at least one cavity 210. The first source gases may include silane and phosphine. The silane gas may be used to provide the silicon, and the phosphine gas may be used to provide the phosphorous. By controlling various parameters during the formation process, such as concentration of the source gases, temperature of the chamber, and pressure of the chamber, epitaxial growth of $Si_3P_4$ and silicon doped with phosphorous may be achieved. In another example, epitaxial growth may lead to silicon doped with phosphorous and with some $Si_3P_4$ phase therein. Epitaxial growth refers to the orderly growth of a crystalline material, where the grown material arranges itself in the same crystal orientation as the underlying structure. Epitaxial growth may occur from one or more surfaces of substrate 201 within cavities 210.

In one specific example, first portion 212 may be provided using a growth process in a chamber having a temperature of between 600° C. and 750° C. and a pressure of between 250 and 660 Torr. In such an example, phosphine of 4.5% bottle concentration may be introduced into the chamber at a flow rate of between 1,000 and 2,500 standard cubic centimeters per minute (sccm), and silane (dichlorosilane) of 100% bottle concentration may be introduced into the chamber at a flow rate of between 300 and 500 sccm. Such a process may yield first portion 212 having silicon with between 2% and 6% phosphorous, in the form of $Si_3P_4$ and silicon doped with phosphorous. First portion 212, grown in such a manner, can have a tensile strain equivalent to silicon doped with 2% carbon. However, unlike silicon doped with carbon, $Si_3P_4$ and silicon doped with phosphorous can be reliably grown with a uniform thickness using parameters as set forth above.

FIG. 2C illustrates forming a second portion 214 of the at least one of the source region or the drain region of the field effect transistor. In the illustrated embodiment, second portion 214 may be formed within the at least one cavity, and includes a second material selected and configured to facilitate second portion 214 having a lower resistance than first portion 212. In one embodiment, second portion 214 is formed using the (same) single mask step used to form first portion 212. For example, after forming first portion 212, using a deposition process in a chamber (e.g., the same chamber), as described above, second source gases may be immediately introduced into the chamber to deposit second portion 214 over first portion 212. As depicted, in one example, second portion 214 may fill a U-shaped depression defined by first portion 212. In another example, second portion 214 may grow into a flat layer filling the U-shape of first portion 212.

In one example, the thickness of second portion 214 is approximately 30-60% of a thickness of first portion 212. In another embodiment, the top surface of second portion 214 may extend above the channel region, by for example, between 10 and 30 nanometers.

In one specific example, second portion 214 may be provided using the growth process in the chamber at a temperature of between 600° C. and 750° C., and a pressure of between 250 and 660 Torr. In this example, in addition to phosphine and dichlorosilane as described above regarding the formation of first portion 212 (with respect to FIG. 2B), methylsilane, such as mono-methylsilane, may be introduced at a flow rate of between 75 and 450 sccm, in order to introduce carbon into second portion 214. In such an example, second portion 214 may include a crystal lattice structure of, for example, $Si_3P_4$ and silicon doped with phosphorous and carbon, along with another material, such as carbon, disposed interstitially (or disposed as a combination of substitutional and interstitial) with respect to the crystal lattice. In this example, this configuration of second portion 214 will have a lower resistance than first portion 212. Note that the temperature, pressure, and flow rates of common gases, may be different when providing second portion 214, as compared with providing first portion 212. In addition, in some process examples, two separate steps may be used to provide the first portion and the second portion, and in other process examples, different techniques may be used to provide the portions, including, for example, chemical vapor deposition and/or atomic layer deposition.

The temperature and pressure used during the formation influences the amount of interstitial carbon, and suitable processing may be used to further reduce the resistance of second portion 214 within the chamber. The interstitial (or substitutional) material, such as interstitial carbon, of second portion 214, can inhibit diffusion of other materials, such as phosphorous, during subsequent fabrication steps such as annealing first portion 212 and second portion 214. By inhibiting diffusion of phosphorous, the interstitial material (or combination of substitutional and interstitial material) can preserve the lower resistance property of second portion 214 during such subsequent fabrication steps, which commonly are needed to control the junction depth during the fabrication of integrated circuits. In one example, the epitaxial first portion 212 is doped with carbon for suppressing phosphorous diffusion and allowing better junction depth control. In another example, second portion 214 is doped with phosphorous for lower resistivity.

Figure 2D:
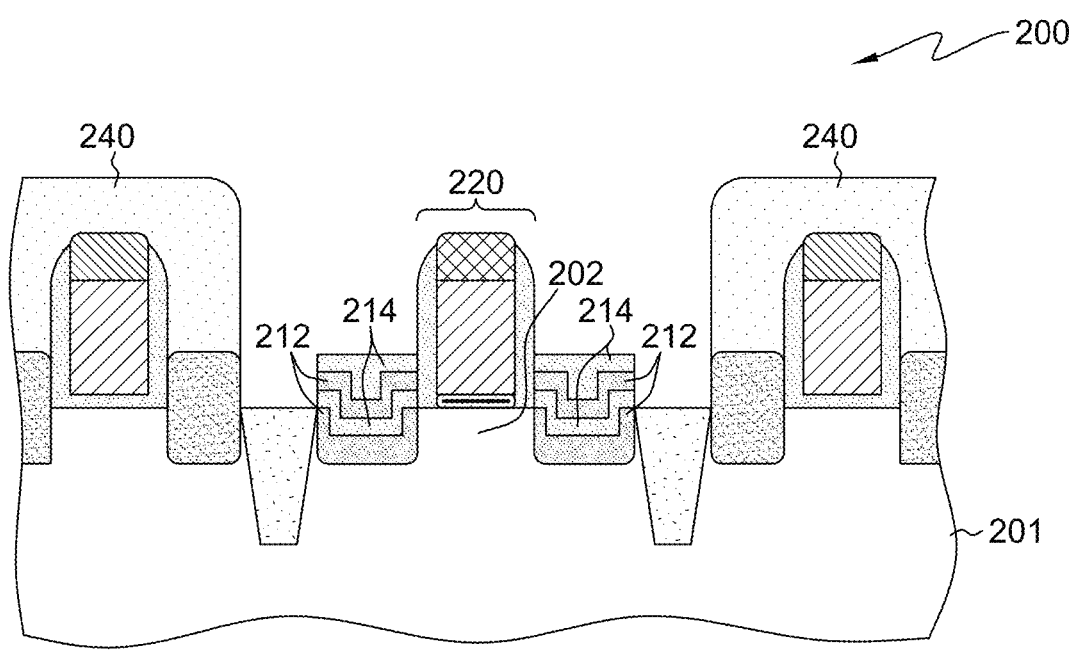
FIG. 2D depicts forming multiple first portions and multiple second portions of at least one of the source region or the drain region of a field effect transistor, in accordance with one or more aspects of the present invention.

FIG. 2D depicts forming multiple first portions and multiple second portions of at least one of the source region or the drain region of a field effect transistor, in accordance with one or more aspects of the present invention. In the illustrated example, multiple first portions 212 and multiple second portions 214 are thin layers that are repeatedly deposited multiple times, by modifying the source gases mentioned above. In such a manner, multiple first portions 212 may be interleaved with multiple second portions 214 as described. For instance, the number of interleaved portions may be 4, 8, 16, 32, 64, or more. In such a configuration, low resistivity, and high mobility may be achieved. In one example, the source and drain regions have an overall top surface overfill of about 20-30 nm above the channel level. In another example, the layers are each approximately 2-3 nm in thickness. In a further example, epitaxial growth of repeated first portion and second portion layers may be achieved continuously in an epitaxial growth by properly injecting the carbon-containing and phosphorous-containing gas flows alternatively in one chamber. In a further example, second portion or first portion may include fluorine (e.g., in addition to carbon) used to inhibit diffusion of phosphorous.

Typically, a source region and a drain region of, for example, an n-type field-effect transistor, may be doped so that the source region and the drain region are n-type material, in order to improve performance of the device. Doping may include one or more steps, such as implantation of dopants followed by an annealing step, to activate the source region and the drain region. Advantageously, because phosphorous is a group V element and is a donor of electrons, first portion 212 and second portion 214, fabricated using the techniques described above with phosphorous, will be an n-type semiconductor material. Thus, the techniques disclosed herein allow for elimination of (e.g., implanted) doping and (e.g., subsequent) activation steps in the fabrication of the field effect transistor.

Subsequent to the processing steps described above, which may result in the formation of a first group of field effect transistors, having, for example, a first conductivity-type, such as n-type, protective mask 240 may be removed from structure 200, and further fabrication steps may be employed to form a second group of field effect transistors, having, for example a second conductivity-type, such as p-type.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
fabricating a field effect transistor, the field effect transistor comprising a source region and a drain region separated by a channel region with a gate structure overlying an upper surface of the channel region, and the fabricating comprising:
using a single mask step in forming a first portion and a second portion of at least one of the source region or the drain region, the first portion comprising a first material selected and configured to facilitate the first portion stressing the channel region, and the second portion comprising a second material selected and configured to facilitate the second portion having a lower electrical resistance than the first portion,
wherein the first material comprises a phase of silicon and silicon doped with phosphorous with a crystal lattice structure, and the second material comprises the phase of silicon and the silicon doped with phosphorous of the first material with the crystal lattice structure of the first material and a second dopant that is not present in the first material disposed interstitially with respect to the crystal lattice structure,
wherein the first portion is formed within at least one cavity adjacent the channel region that extends from the upper surface of the channel region, and wherein the first portion extends above the upper surface of the channel region.

2. The method of claim 1, wherein the phase of silicon comprises $Si_3P_4$ and the second dopant of the second material comprises carbon.

3. The method of claim 1, further comprising providing, before the forming, a semiconductor substrate, the semiconductor substrate comprising a source cavity and a drain cavity separated by the channel region, wherein the forming comprises:

forming, using the single mask step, the first portion and the second portion within at least one of the source cavity or the drain cavity of the semiconductor substrate.

4. The method of claim 3, wherein the forming comprises:
using first source gases to deposit the first portion within the at least one of the source cavity or the drain cavity of the semiconductor structure; and
using second source gases to deposit the second portion over the first portion, the second source gases including, at least in part, the first source gases.

5. The method of claim 4, wherein the first source gases comprise phosphine and the second source gases comprise phosphine and methylsilane.

6. The method of claim 3, wherein the forming comprises:
growing the first material with a crystal lattice structure within the at least one of the source cavity or the drain cavity; and
providing another material interstitially with respect to the crystal lattice structure of the first material to form the second material of the second portion.

7. The method of claim 3, wherein the forming comprises growing epitaxially the first portion and the second portion from the semiconductor substrate within the at least one of the source cavity or the drain cavity.

8. The method of claim 1, wherein the first material of the first portion comprises an internal tensile strain, the internal tensile strain inducing a stress on the channel region, the stress facilitating increased mobility of charge carriers within the channel region of the field effect transistor.

9. The method of claim 1, wherein the method comprises fabricating a plurality of field effect transistors, the plurality of field effect transistors comprising the field effect transistor and other field effect transistors, and the forming comprising:
providing a protective mask over the other field effect transistors;
forming, after the providing, the first portion and the second portion of the at least one of the source region or the drain region of the field effect transistor; and
removing, after the forming, the protective mask from over the other field effect transistors.

10. The method of claim 1, wherein the second material comprises carbon, and the fabricating further comprises annealing, after the forming, the first portion and the second portion, wherein the carbon of the second material of the second portion inhibits diffusion of the first material during the annealing.

11. The method of claim 1, wherein the forming comprises forming first portions in both the source region and the drain region, and second portions in both the source region and the drain region.

12. The method of claim 11, further comprising providing, before the forming, a semiconductor substrate, the semiconductor substrate comprising a source cavity and a drain cavity separated by the channel region, wherein the forming comprises:
forming, using the single mask step, the first portions and the second portions within the source cavity and the drain cavity of the semiconductor substrate.

13. The method of claim 11, wherein the phase of silicon comprises $Si_3P_4$ and the second dopant of the second material comprises carbon.

14. The method of claim 11, wherein the first material of the first portions comprises internal tensile strains, the internal tensile strains inducing stresses on the channel region, the stresses facilitating increased mobility of charge carriers within the channel region of the field effect transistor.

15. The method of claim 1, wherein the first portion is one of multiple first portions and the second portion is one of multiple second portions, and the forming comprises forming the multiple first portions and the multiple second portions, the multiple first portions comprising the first material, and the multiple second portions comprising the second material, wherein the multiple first portions are interleaved with the multiple second portions.

16. The method of claim 1, wherein the field effect transistor includes a gate structure overlying the channel region, and wherein field effect transistor is configured such that when an appropriate voltage is applied on the gate structure, charge carriers flow from the source region to the drain region through the channel region.

17. The method of claim 1, wherein the at least one cavity extends between the channel region and a shallow trench isolation region, and wherein the first portion extends above an upper surface of the shallow trench isolation region.

18. The method of claim 1, wherein the second dopant of the second material is disposed as a combination of interstitial and substitutional with respect to the crystal lattice structure.

* * * * *